(12) United States Patent
Dong et al.

(10) Patent No.: US 7,229,880 B2
(45) Date of Patent: Jun. 12, 2007

(54) PRECISION CREATION OF INTER-GATES INSULATOR

(75) Inventors: Zhong Dong, San Jose, CA (US); Chuck Jang, Fremont, CA (US); Chunchieh Huang, Fremont, CA (US)

(73) Assignee: ProMOS Technologies Inc., Hsin-Chu (TW)

( * ) Notice: Subject to any disclaimer, the term of this patent is extended or adjusted under 35 U.S.C. 154(b) by 205 days.

(21) Appl. No.: 10/718,008

(22) Filed: Nov. 19, 2003

(65) Prior Publication Data

US 2005/0106793 A1    May 19, 2005

(51) Int. Cl.
    *H01L 21/336*      (2006.01)

(52) U.S. Cl. .................... 438/257; 438/211; 257/315; 257/316

(58) Field of Classification Search ............... 438/211, 438/257–267; 257/315–316
See application file for complete search history.

(56) References Cited

U.S. PATENT DOCUMENTS

| 6,346,448 | B1 * | 2/2002 | Kobayashi | ............... | 438/303 |
| 6,566,205 | B1 * | 5/2003 | Yu et al. | .................... | 438/287 |
| 6,649,542 | B2 * | 11/2003 | Miura et al. | ............... | 438/791 |
| 6,657,249 | B2 * | 12/2003 | Nishioka et al. | ............ | 257/315 |
| 6,661,065 | B2 * | 12/2003 | Kunikiyo | ................... | 257/411 |
| 6,812,515 | B2 * | 11/2004 | Rabkin et al. | .............. | 257/315 |
| 2003/0100153 | A1 * | 5/2003 | Kunori | ....................... | 438/197 |
| 2004/0094793 | A1 * | 5/2004 | Noguchi et al. | ............ | 257/315 |
| 2005/0040401 | A1 * | 2/2005 | Yamazaki et al. | ............ | 257/72 |
| 2005/0074982 | A1 * | 4/2005 | Lee et al. | ................... | 438/763 |

* cited by examiner

*Primary Examiner*—Zandra V. Smith
*Assistant Examiner*—Thanh Y. Tran
(74) *Attorney, Agent, or Firm*—MacPherson Kwok Chen & Heid LLP; Gideon Gimian

(57) ABSTRACT

An ONO-type inter-poly insulator is formed by depositing intrinsic silicon on an oxidation stop layer. In one embodiment, the oxidation stop layer is a nitridated top surface of a lower, and conductively-doped, polysilicon layer. In one embodiment, atomic layer deposition (ALD) is used to precisely control the thickness of the deposited, intrinsic silicon. Heat and an oxidizing atmosphere are used to convert the deposited, intrinsic silicon into thermally-grown, silicon dioxide. The oxidation stop layer impedes deeper oxidation. A silicon nitride layer and an additional silicon oxide layer are further deposited to complete the ONO structure before an upper, and conductively-doped, polysilicon layer is formed. In one embodiment, the lower and upper polysilicon layers are patterned to respectively define a floating gate (FG) and a control gate (CG) of an electrically re-programmable memory cell. In an alternative embodiment, after the middle, silicon nitride of the ONO structure is defined, another layer of intrinsic silicon is deposited, by way of for example, ALD. Heat and an oxidizing atmosphere are used to convert the second deposited, intrinsic silicon into thermally-grown, silicon dioxide. An ONO structure with two thermally-grown, and spaced apart, silicon oxide layers is thereby provided.

22 Claims, 11 Drawing Sheets

301 POLY-1 DEPOSITION

302 NITRIDATION

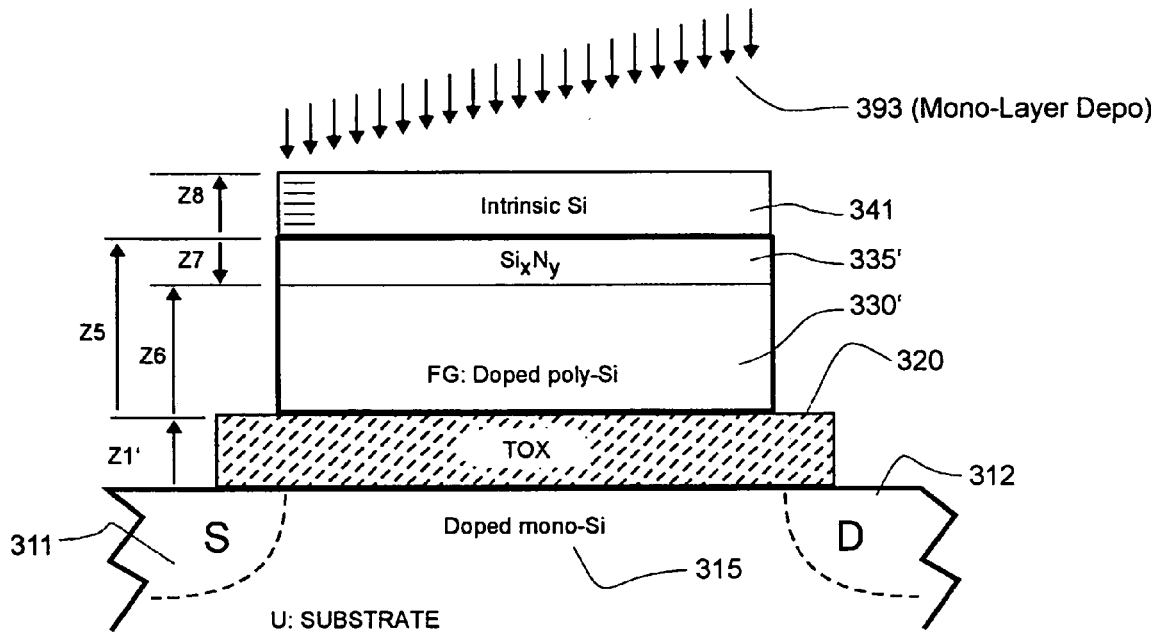
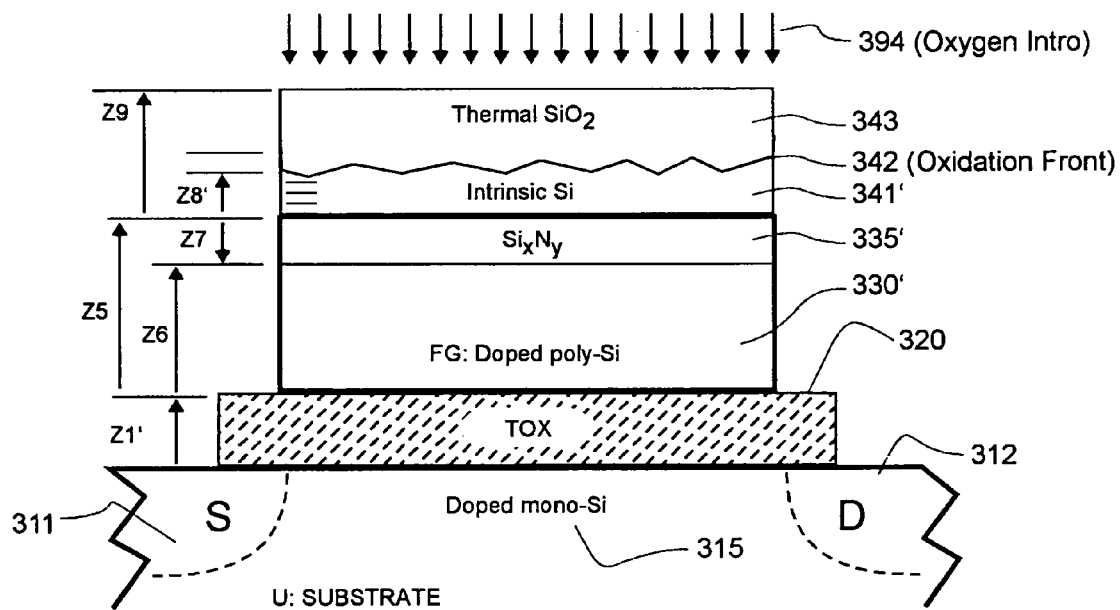

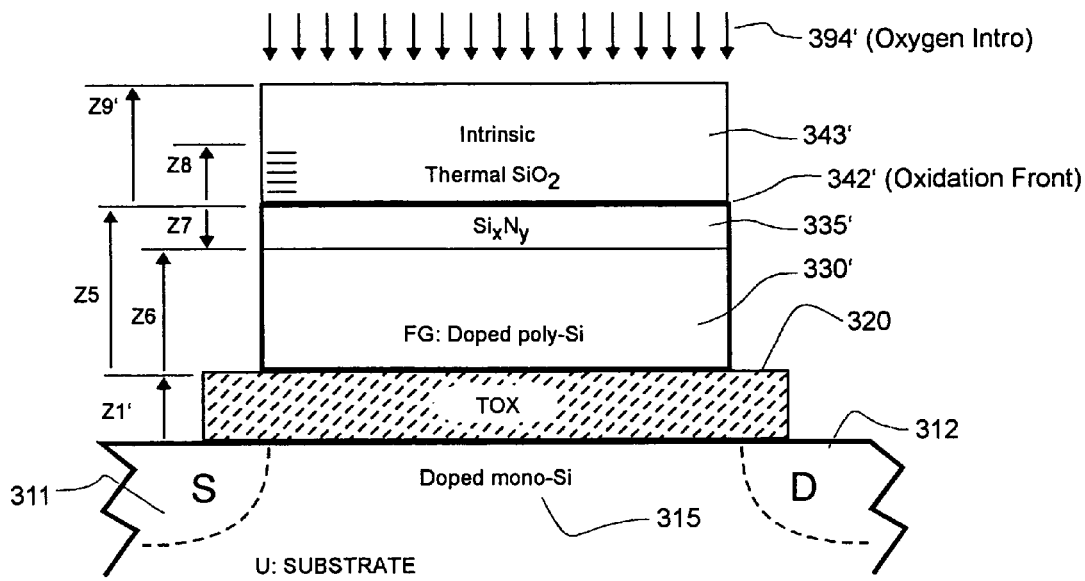
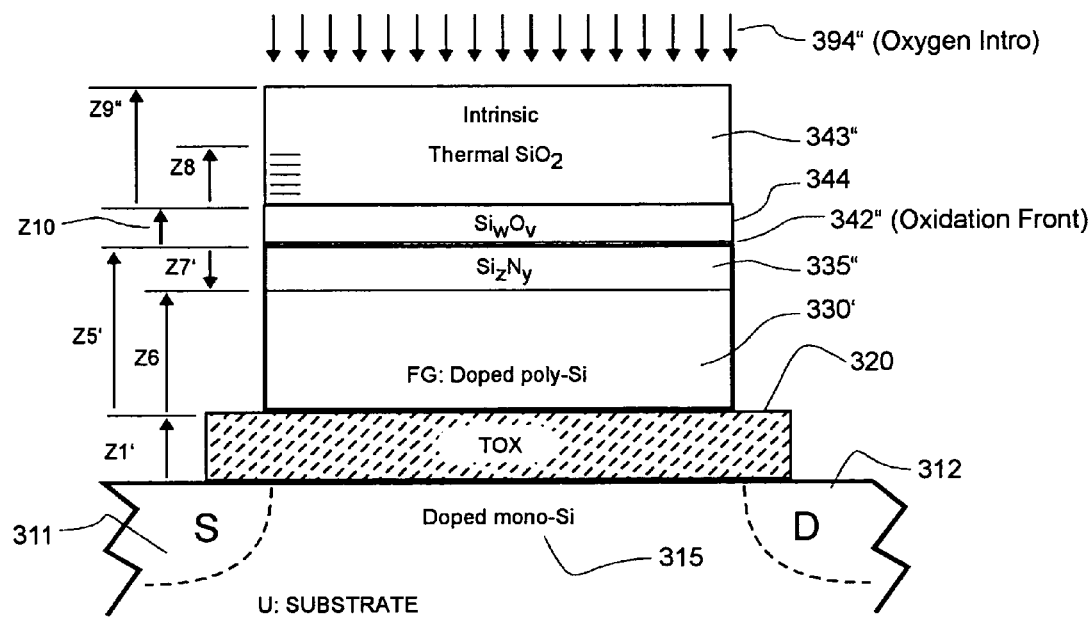

307 — Deposit Middle SiN Layer

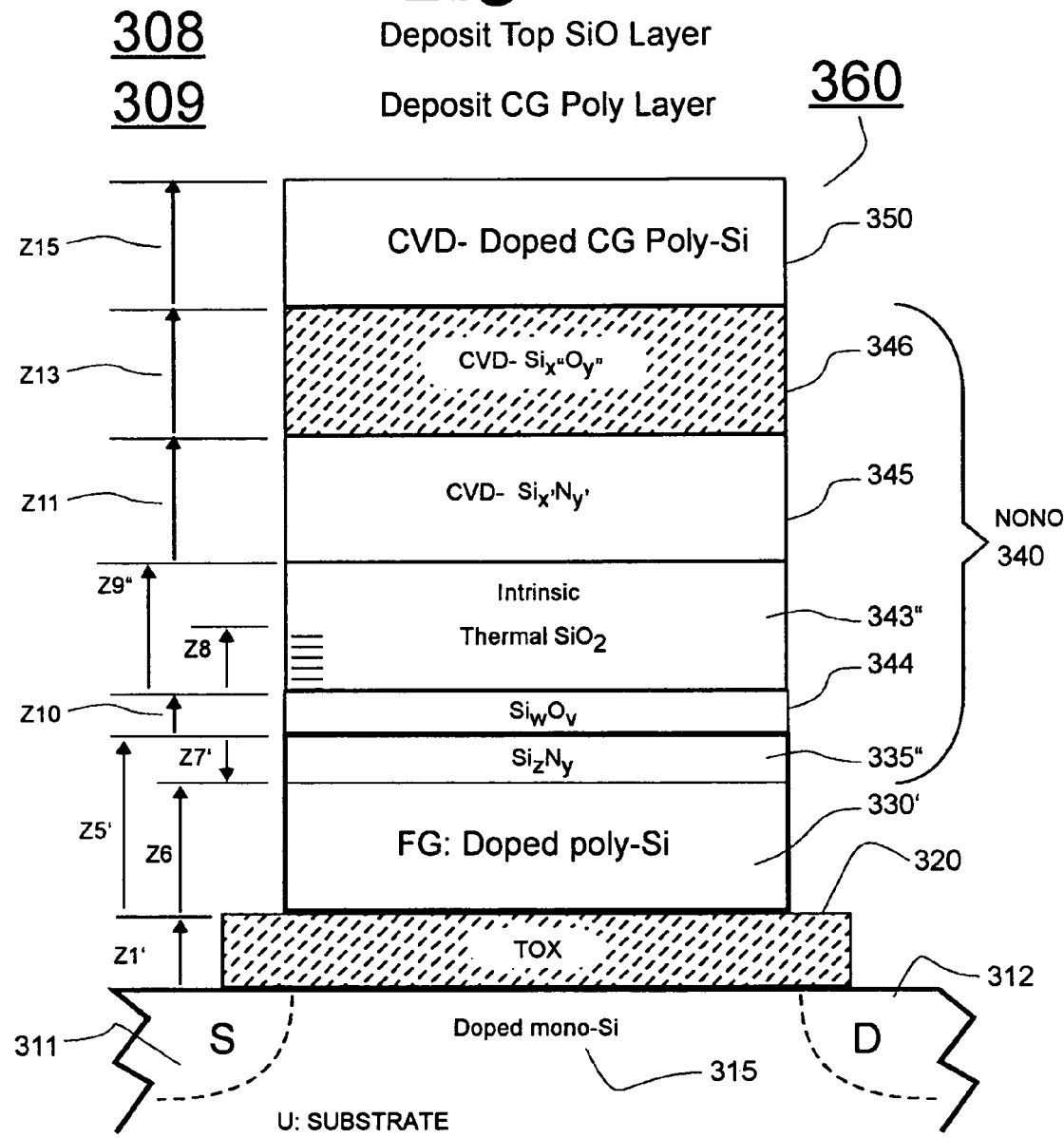

US 7,229,880 B2

PRECISION CREATION OF INTER-GATES INSULATOR

FIELD OF DISCLOSURE

The present disclosure of invention relates generally to semiconductor devices and to the manufacture of the same.

The disclosure relates more specifically to mass production of insulated gate field effect transistors (IGFET's, MOSFET's) which have plural gate electrodes separated from one another by electrically insulative material. Yet more specifically, it relates to so-called ONO structures which can be used to separate stacked polysilicon gates in electrically re-programmable and nonvolatile memory devices.

CROSS REFERENCE TO CO-OWNED APPLICATIONS

The following copending U.S. patent application is owned by the owner of the present application, and its disclosures is incorporated herein by reference:

(A) Ser. No. 10/071,689 filed Feb. 8, 2003 by Zhong Dong et al and which is originally entitled, "Floating Gate Nitridation".

CROSS REFERENCE TO PATENTS

The disclosures of the following U.S. patents are incorporated herein by reference:

(A) U.S. Pat. No. 6,613,695 B2, issued Sep. 2, 2003 to Pomarede et al. and entitled "Surface Preparation Prior to Deposition".

In order to avoid front end clutter, the cross referencing section continues as (2c) at the end of the disclosure, slightly prior to recitation of the patent claims.

DESCRIPTION OF RELATED ART

So-called, FLASH memory devices and alike forms of electrically re-programmable and nonvolatile memory devices have become commercially popular due in part to their ability to store data in a small and dense form factors, their ability to be repeatedly re-programmed, and their ability to retain programmed data in a nonvolatile fashion so that even when power is lost, the stored data is preserved.

One relatively simple format for such an electrically re-programmable type of nonvolatile memory is known as the vertically-stacked gate configuration. In this configuration, a so-called "floating gate" (FG) electrode is insulatively sandwiched between an underlying, tunnel insulator layer and an overlying, inter-gates insulator (IGI) layer. A so-called "control gate" (CG) electrode is stacked atop the inter-gates insulator (IGI) layer. A channel region with opposed source (S) and drain (D) regions lies under the tunnel insulator layer.

Because of the way the layers are stacked, the IGI layer (inter-gates insulator layer) is sandwiched between the floating gate electrode (FG) and the control gate electrode (CG). This sandwiching of material layers can create problems as will be further explained shortly. In passing, it is to be observed that other types of more complicated configurations of gate electrodes are possible, including various staggered gate configurations. The simpler, stacked gate configuration will be sufficient for describing the improvement disclosed herein.

The insulatively-isolated floating gate (FG) of a staked gate cell is intended to store a certain amount of charge and retain that charge even when external power is turned off. The amount of charge stored on the FG defines the data state of the memory cell. The state of the memory cell can be altered by moving charge into the FG for representing a first data state and by removing charge from the FG for representing another data state. Different mechanisms may be used for injecting charge into or removing charge from the FG, including hot carrier injection and/or Fowler-Nordheim tunneling. The charged or uncharged state of the floating gate (FG) can be sensed by applying a cell-read voltage $V_{GS-read}$ to the control gate (CG), where the cell-read voltage $V_{GS-read}$ is selected to cause a first magnitude of current conduction between the drain (D) and source (S) regions of the cell when the floating gate (FG) is in a first programmed state and to cause no or a different magnitude of $I_{DS}$ to flow when the floating gate (FG) is in another programmed state. (Some devices store multiple data bits per cell, where each of different amounts of charge trapped within the FG represents a different multi-bit pattern.)

It is important, for purposes of carrying out the various read and write operations of floating gate type memory cells (e.g., stacked gate cells), to establish an appropriate pattern of electric field intensities across the insulators that surround the charge-storing, floating gate (FG). These electric fields (E-fields) may be established by generating correspondingly appropriate voltages between the control gate (CG), the drain (D), the source (S) and/or substrate (U) regions of the memory cell. Those skilled in the art will appreciate that electric field intensity in dielectric insulators is usually a function of voltage difference (V) divided by dielectric thickness (d) and multiplied by dielectric constant (E=kV/d). In order to get consistent results from mass produced devices, it is important to maintain precise control over the dielectric thickness (d) and the dielectric constant (k) of the various insulators which surround the FG of each cell so that same results will occur in one device and the next for a given control gate voltage ($V_{CG}$). Stated otherwise, consistently same capacitive coupling should occur from one mass produced device to the next between the CG, the FG, the source (S), the drain (D) and the substrate (U).

Persons skilled in the art will appreciate that most insulators are not perfect. A small amount of leakage current can undesirably flow through them. They can undergo high voltage breakdown. Contaminating chemicals can pass through pinhole or other defects in the insulators. Much progress has been made in the formation of the so-called, thermal gate oxide insulator that lies between the substrate and the floating gate (FG). However, the inter-gates insulator layer (IGI) that is sandwiched between the FG and the CG still suffers from problems.

The inter-gates insulator layer (IGI) is particularly prone to problems with leakage current and breakdown. Practitioners in the art have developed a so-called ONO solution. According to basic ONO practice, after the material for the floating gate (FG) is deposited (typically it is doped polysilicon), three insulative layers are vapor deposited in sequence. The three insulative layers are respectively composed of silicon-Oxide, silicon-Nitride and silicon-Oxide; hence the ONO acronym. The material for the control gate (CG) is then deposited (typically it is doped polysilicon) on top of the ONO structure. The ONO structure is advantageous because silicon-nitride ($Si_3N_4$) generally has a greater dielectric constant (k) than does silicon dioxide ($SiO_2$). The higher dielectric constant of the silicon-Nitride layer in the ONO stack lets cell designers use lower gate voltages than would otherwise be possible for an equal thickness of insulator material made of only silicon-oxide. It is desirable to keep gate voltages relatively small. The ONO approach allows this to happen.

Despite improvements in vapor deposition techniques, the ONO approach still suffers from the existence of small leakage currents between the FG and the CG. Precise control of ONO thickness and material quality within the ONO stack also remains a problem.

One improvement over the conventional ONO structure is disclosed in our above-cited U.S. patent application Ser. No. 10/071,689 ("Floating Gate Nitridation"). Briefly, nitrogen is introduced into the top surface of the doped-polysilicon FG layer after that layer is deposited. The nitrogen concentration is about 1% to about 20% atomic in the top of the FG layer after nitridation. A higher quality silicon oxide is formed atop the nitridated FG layer, in one embodiment of Ser. No. 10/071,689, by exposing the nitridated, doped-polysilicon to an oxidizing atmosphere. This consumes silicon atoms out of the nitridated region and creates an $Si_xO_y$ layer atop the silicon-depleted-and-nitrogen-containing layer below. The nitrogen-containing layer below acts as an oxidation stop. The technique of Ser. No. 10/071,689 can therefore provide a NONO insulator structure with enhanced insulative properties. Room for yet further improvement is nonetheless available.

INTRODUCTORY SUMMARY

Structures and methods may be provided in accordance with the present disclosure of invention for improving over the above-described art.

More specifically, in accordance with one set of aspects of the present disclosure, the upper surface of a silicon floating gate (FG) is nitridated to thereby define a non-stoichiometric silicon nitride ($Si_xN_y$) surface having a nitrogen content of at least 5% (atomic), and more preferably about 10% to 20% (atomic). This nitridated surface will serve as an oxidation stop. A thin film of intrinsic (essentially undoped) silicon is then deposited on the $Si_xN_y$ surface. Heat and an oxidizing atmosphere are then provided for converting the deposited, intrinsic silicon into a thermally-grown silicon oxide layer ($Si_mO_n$, where typically m=1 and n=2). The non-stoichiometric silicon nitride ($Si_xN_y$) layer blocks oxidation below it. Some of the silicon atoms in the $Si_xN_y$ layer may be consumed by the oxidizing atmosphere in the process to create further amounts of thermally generated, silicon oxide ($Si_wO_v$, where typically w=1 and v<2). At least part of the thermally-formed, silicon oxide structure is dopant-free $SiO_2$ as a result of the earlier deposition of the intrinsic silicon film.

In one set of embodiments, atomic layer deposition (ALD) is used for precisely controlling the thickness of the intrinsic silicon film. After oxidation of the intrinsic silicon film, a film of stoichiometric silicon nitride ($Si_3N_4$) is vapor deposited. Thereafter a silicon oxide film is formed to complete the NONO structure. A control gate (CG) is formed over the NONO structure. Charge leakage between the floating gate (FG) and the control gate (CG) of this embodiment is reduced because the thermally-grown and dopant-free oxide portion of the NONO structure exhibits good insulating properties, particularly because it is grown from intrinsic silicon.

In accordance with an overlapping or somewhat separate aspect of the present disclosure, the lower surface of a control gate (CG) has thermally-grown oxide formed directly under it. In the course of forming an ONO or NONO structure in accordance with this aspect, a thin film of intrinsic silicon (essentially dopant-free) is deposited after the upper, film of stoichiometric silicon nitride ($Si_3N_4$) is vapor deposited to define the middle nitride layer of the ONO or NONO structure. The structure is then subjected to an oxidizing atmosphere so as to convert the intrinsic silicon film into a thermally-grown and essentially dopant-free oxide layer. The stoichiometric silicon nitride ($Si_3N_4$) layer blocks oxidation below it. In one set of embodiments, atomic layer deposition (ALD) is used for precisely controlling the thickness of the upper intrinsic silicon film. After oxidation of the upper intrinsic silicon film, the material (e.g., doped polysilicon) of the control gate (CG) is vapor deposited. In an overlapped embodiment, both the upper and lower silicon oxide layers of a NONO structure are thermally-grown from intrinsic silicon and both of the intrinsic silicon layers are provided by way of ALD.

An insulating structure in accordance with the disclosure comprises: (a) an oxidation stop layer; and (b) a thermally-grown, intrinsic, silicon oxide layer which has been grown from ALD deposited intrinsic, silicon that had been deposited on said oxidation stop layer.

An isolation providing method in accordance with the present disclosure comprises: (a) defining an oxidation stop layer above a conductively-doped, first semiconductor layer; (b) providing an intrinsic silicon layer on the oxidation stop layer; (c) oxidizing at least a sublayer portion of the intrinsic silicon layer so as to thereby create a thermally-grown, intrinsic silicon oxide sublayer over the first semiconductor layer; and (d) disposing a conductively-doped, second semiconductor layer above the intrinsic silicon oxide sublayer so that the intrinsic silicon oxide sublayer provides isolation between the first and second conductively-doped, semiconductor layers.

Other aspects of the disclosure will become apparent from the below detailed description.

DESCRIPTION OF THE DRAWINGS

The below detailed description section makes reference to the accompanying drawings, in which:

FIG. 3C is a cross sectional schematic diagram showing a third step (precise Si deposition) in a continuation of the fabrication method of FIG. 3B;

FIG. 3D is a cross sectional schematic diagram showing a fourth step (beginning of oxidation of precisely deposited and intrinsic Si) in a continuation of the fabrication method of FIG. 3C;

FIG. 3E is a cross sectional schematic diagram showing continuation of the oxidation begun by the step of FIG. 3D;

FIG. 3F is a cross sectional schematic diagram showing an optional further continuation of the oxidation begun by the step of FIG. 3D;

FIG. 3H is a cross sectional schematic diagram showing a set of further steps (CVD deposition of SiO and CVD deposition of CG) in a continuation of the fabrication method of FIG. 3G;

DETAILED DESCRIPTION

Figure 1:
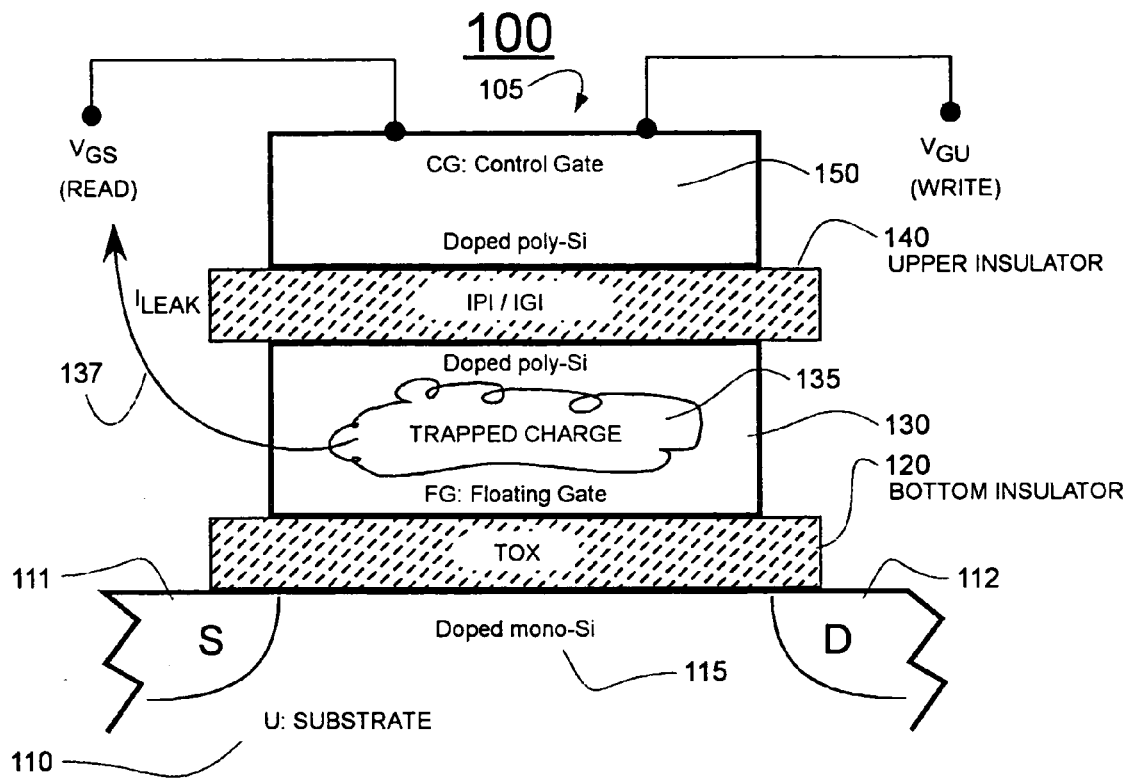
FIG. 1 is a conceptual schematic diagram showing an environment in which it is valuable to form a good, but relatively thin, electrical insulator between two, conductively-doped semiconductor layers (e.g., to thereby form an inter-poly or inter-gates insulator)

FIG. 1 is a conceptual schematic diagram showing in cross section, an environment 100 in which it may be useful to form a good, but thin, electrical insulator 140 between two, conductively-doped semiconductor layers, 130 and 150. More specifically, the not-to-scale diagram of FIG. 1 shows the structure of a stacked-gate memory cell. The cell 105 is integrally formed as part of a monolithically integrated circuit having a common substrate 110. In one embodiment, the substrate 110 includes doped monocrystalline silicon. Spaced apart source (S) 111 and drain (D) 112 regions may be formed by implant of suitable doping about an oppositely doped, channel portion 115 of the monocrystalline silicon substrate 110. A relatively thin oxide layer (so-called tunnel oxide, or TOX) may be provided on the surface of the channel portion 115. Typically, the TOX is thermally grown from the underlying, monocrystalline silicon 115. (The TOX may be thermally grown prior to threshold implant of dopants into channel portion 115 and prior to the implant doping of the source and drain regions, 111–112. Doping is understood to include the provision of impurity atoms such as boron, arsenic or phosphorus into the semiconductor crystal structure to impart P-type or N-type conductivity to the doped semiconductor region.)

A first, electrically-conductive gate electrode 130 is formed over the TOX layer 120, typically by chemical vapor deposition (CVD) of doped, polysilicon. A so-called, inter-poly or inter-gates insulator (IPI or IGI) 140 is formed over the first gate electrode 130. A second, electrically-conductive gate electrode 150 is formed over the IGI layer 140. Typically, the second gate electrode 150 is fabricated by CVD of doped polysilicon.

Patterning of the gate electrodes (130,150) may occur before or after the source/drain doping implants. Typically, the source/drain doping implants occur after patterning so as to provide for self-alignment with the patterned gates. Post-patterning sidewalls of the first and/or second gate electrodes 130–150 as well as those of the IGI layer 140 may be surrounded by additional insulative material (e.g., additional silicon dioxide) and/or may be embedded in shallow-trench isolation (STI) wells as may be appropriate. No specific top-view patterning is intended by the conceptual side view of FIG. 1. During device fabrication, electrical connections are typically made to the second gate electrode 150 (hereafter also, the control gate or CG), to the source region (S) 111, to the drain region (D) 112, and to the substrate (U) 110, but not to the first gate electrode 130. The insulation-surrounded first gate electrode 130 is commonly referred to as the floating gate (FG).

Those skilled in the art will appreciate that the floating gate (FG) 130 is typically used to nonvolatiley store trapped charge 135. This charge 135 may be injected into the FG 130 or removed from the FG 130 by way of hot carrier injection or Fowler-Nordheim tunneling, usually with the injected/extracted moving or tunneling through the tunnel oxide (TOX) 120. When charge is being purposefully injected into the FG 130 or being removed from it, a relatively large, writing voltage ($V_{GU}$) is typically established between the control gate (CG) 150 and the substrate (U) 110. Charge then tunnels or otherwise crosses through the thin TOX layer 120 in the desired direction to add to, or subtract from the amount of charge already present in the floating gate (FG) 130.

It is desirable to have precise control over the amount of charge being moved into or being removed from the FG 130 during a write cycle because the amount of charge remaining in the FG after a write cycle will determine the memory state of the cell 105. More specifically, the state of the floating gate (FG) will be generally sensed by applying a cell-read voltage $V_{GS-read}$ between the control gate (CG) and the source region (S) 111 or another reference node. The magnitude of the cell-read voltage $V_{GS-read}$ will be pre-selected to cause a first magnitude of current, $I_{DS}$ (not shown) to flow between the drain (D) and source (S) regions of the cell when the floating gate (FG) is in a first programmed state (e.g., representing a binary 1) and to cause no or a different magnitude of IDS to flow when the floating gate (FG) is in another programmed state (e.g., representing a binary 0). The charged state of the FG 130 is not limited to just two distinct states. Some memory devices are designed to store multiple data bits per cell, where each of different amounts of charge 135 trapped within the FG represents a different one of the multi-bit patterns (e.g., 00, 01, 10 and 11). The above are just examples. The amount of charge 135 trapped within the FG 130 may alternatively represent an analog value.

The amount of charge moved into or out of the FG 130 during a write cycle is often determined by a number of factors including the distribution and intensity of electric flux lines through the TOX 120 and the composition and physical dimensions of the TOX. The latter, electric flux lines through the TOX are in their turn, often defined by the voltages present on the control gate (CG) 150, the drain (D) 112, the source (S) 111, and the substrate (U) 110 regions of the memory cell 105. The electric flux lines (not shown) are further defined by the composition and physical dimensions of the IPI/IGI layer 140. More specifically, those skilled in the art will appreciate that electric field intensity in the dielectric insulator or insulators of the IPI/IGI layer 140 will usually be a function of voltage gradient (V) across each of the insulators in the IGI, where the voltages are divided by the respective dielectric thickness (d) and multiplied by the respective dielectric constant (k) of the insulators. This may be roughly expressed as E=kV/d. (In actual practice, a more detailed analysis is often conducted using Maxwell's equations. There is no need to delve into such details here.)

It may be understood from the above that mass production fabrication of a multi-gate cells such as 105 shown in FIG. 1 will often call for precise control over the respective dielectric thicknesses (d) and the respective dielectric constants (k) of the various insulators which are provided around the FG 130. Precision is desired so that same results will occur in one device and the next for a given control gate voltage ($V_{CG}$) in combination with other voltages and further factors (e.g., temperature). In order to get such consistent results in mass produced devices, it is important to maintain consistency with respect to the dimensions and compositions of the insulators that that form the IGI layer 140 and the TOX 120. Stated otherwise, consistently same capacitive coupling should occur from one mass produced device to the next between the CG, the FG, the source (S), the drain (D) and the substrate (U).

Persons skilled in the art will appreciate that most insulators are not perfect. A small amount of leakage current can undesirably flow through them. They can undergo high voltage breakdown. Contaminating chemicals can pass through pinhole or other defects in the insulators. The inter-gates insulator layer (IGI) 140 is particularly prone to problems with leakage current because, unlike the TOX layer 120, the IGI 140 is generally sandwiched between two layers of doped polysilicon: the CG 150 and the FG 130. Artisans have learned that the IGI 140 will not be very good if it made through brute-force oxidation of doped polysilicon in the FG layer 130. Practitioners in the art have developed a so-called ONO solution.

Figure 2:
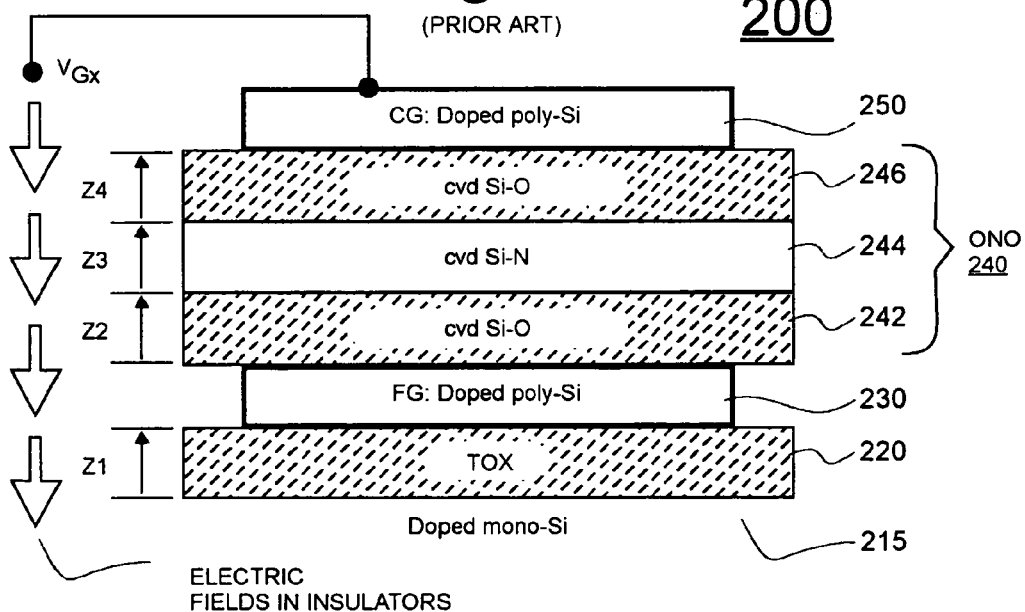
FIG. 2 is a cross sectional schematic diagram showing how a conventional ONO structure is formed to serve as an inter-poly insulator between stacked gates of a nonvolatile memory device.

The conventional ONO solution is illustrated in the cross sectional view (not-to-scale) of FIG. 2. After TOX (220) is grown to a first thickness (Z1) and the doped polysilicon material for the floating gate (FG) 230 is deposited, three insulative layers are deposited in sequence by means of CVD. The three insulative layers are respectively composed of silicon-Oxide (242, having thickness Z2), silicon-Nitride (244, having thickness Z3) and silicon-Oxide (246, having thickness Z4); hence the ONO acronym (240). The material for the control gate (CG) 250 is then deposited (typically it is doped polysilicon) on top of the ONO structure 240. Because stoichiometric silicon-nitride ($Si_3N_4$) generally has a greater dielectric constant (k) than does silicon dioxide ($SiO_2$) or other silicon oxides ($Si_xO_y$), the higher dielectric constant of the silicon-Nitride layer 244 in the ONO stack 240 lets cell designers use lower gate voltages ($V_{GS-read}$, $V_{GU-write}$) than would otherwise be necessary for an equal thickness (Z2+Z3+Z4) of insulator material made of only silicon-oxide. It is desirable to keep gate voltages relatively small. Thus the ONO solution has become very popular.

Despite improvements with vapor deposition techniques, the ONO approach still suffers from the presence of leakage current 137 ($I_{LEAK}$) between the FG (130, 230) and the CG (150, 250). Precise control of ONO thickness (Z2+Z3+Z4) and material quality within the ONO stack 240 remains a problem.

One improvement over the conventional ONO structure 240 (FIG. 2) is disclosed in our above-cited U.S. patent application Ser. No. 10/071689 ("Floating Gate Nitridation"). Briefly, a small amount of nitrogen (e.g., about 1%–20% atomic) is introduced into the top surface of the doped-polysilicon FG layer after that layer is deposited. The nitridated layer is subjected to a high temperature oxygen-containing atmosphere. Silicon atoms in the nitridated layer are scavenged by the hot oxygen-containing atmosphere to form a thermally-grown, silicon oxide. The increased concentration of nitrogen in the silicon-scavenged area stops the oxidation front from moving deeper into the FG layer. A higher quality of silicon oxide may be formed atop the nitridated FG layer by this thermally-growth technique. The technique provides a NONO insulator structure with enhanced insulative properties. Room for yet further improvement is available.

Figure 3A:
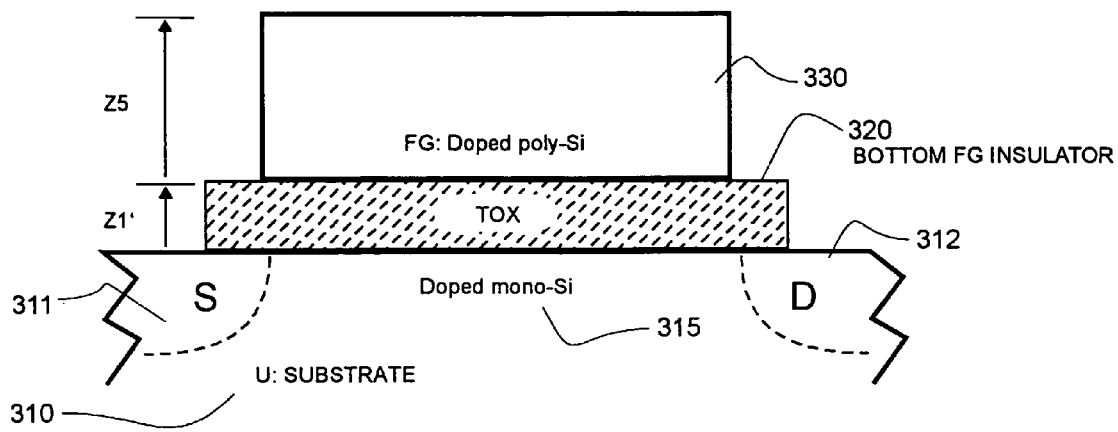
FIG. 3A is a cross sectional schematic diagram showing a first step (poly-1 deposition) in an IGI fabrication method in accordance with the present disclosure.

FIG. 3A is a cross sectional schematic diagram showing a first step 301 (Poly-1 deposition) in an IGI fabrication method in accordance with the present disclosure. Briefly, after TOX layer 320 is thermally-grown to thickness Z1', a doped polysilicon layer 330 is deposited to thickness Z5. In one embodiment, thickness Z5 is in the range of about 1000 Å to about 2000 Å. TOX thickness Z1' is in the range of about 10 Å to about 100 Å, and in a more specific set of embodiments, Z1'is in the range of about 30 Å to about 50 Å. The source and drain regions 311, 312 are typically not yet have formed at this stage and are shown in phantom (dashed lines) simply to provide a point of reference for what will later develop around channel region 315 of the monocrystalline silicon substrate, 310.

Figure 3B:
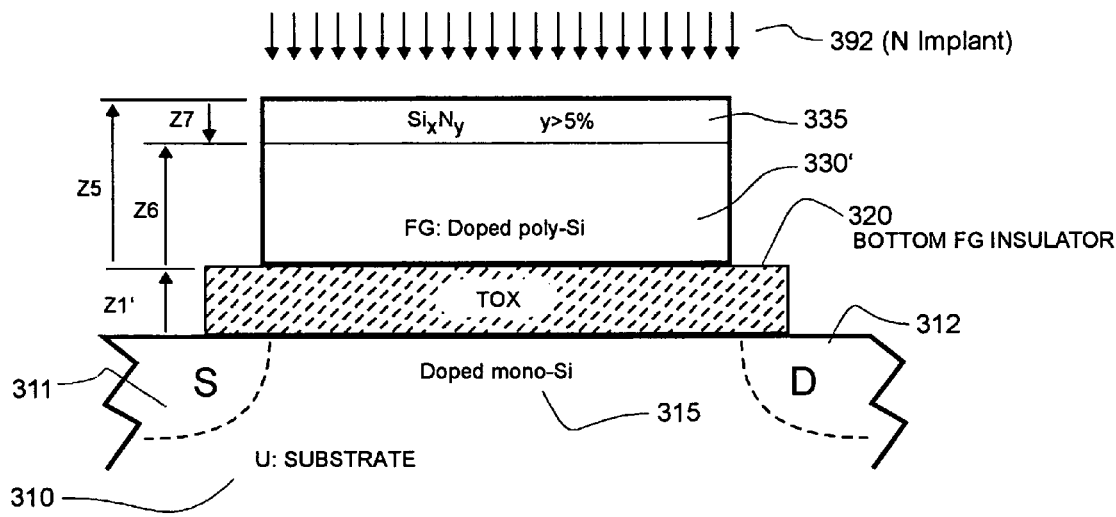
FIG. 3B is a cross sectional schematic diagram showing a second step (nitridation) in a continuation of the fabrication method introduced by FIG. 3A.

FIG. 3B is a cross sectional schematic diagram showing a second step 302 (nitridation) in a continuation of the fabrication method introduced by FIG. 3A. A nitrogen implant 392 and/or other means are used to introduce nitrogen atoms into top region 335 of the doped polysilicon layer 330. This forms an $Si_xN_y$ composition in region 335 to a depth Z7 below the surface, where y is sufficiently large to provide a concentration of at least 1% atomic nitrogen, and better yet, at least about 5% atomic nitrogen, and more preferably, at least about 10% atomic nitrogen. Various techniques can be used to form an oxidation-stopping gradient wherein nitrogen concentration in region 335 rises to as high as about 20% to 30% atomic nitrogen. Nitridation by way of ion implant may include the application to FG layer 330 (FIG. 3A) of a dose of $10^{13}$ to $10^{15}$ atoms/cm$^2$ or higher of nitrogen at energies in the range 1 KeV to about 30 KeV to form a homogenous or graded $Si_xN_y$ composition in region 335 to the Z7 depth. Z7 can be as little as about 10 Å and should be no more than about 30 Å. The ion implant may be followed by a thermal anneal in an inert atmosphere at 850° C. to about 1000° C. for about 10 to 60 seconds. A Z7 thickness of as little as about 5 Å may be obtained if alternate nitridation techniques are used such as DPN (Decoupled Plasma Nitridation) or RPN (Remote Plasma Nitridation) are used. A combination of ion implant and DPN or RPN may be used, followed by optional thermal anneal, to provide a nitrogen concentration gradient where nitrogen density increases moving deeper down the Z7 depth. The relatively high concentration of nitrogen will be used to slow down or stop a descending oxidation front (342 in FIG. 3D) as will be seen below.

While FIG. 3B shows the surface layer 335 as having just a $Si_xN_y$ composition, it is within the contemplation of the disclosure to incorporate other atoms within this region including an oxygen gradient whose oxygen density decreases moving deeper down the Z7 depth while at the same time nitrogen concentration increases when moving deeper down the Z7 depth. The oxygen atoms may be ion implanted or otherwise introduced into surface region 335 together with nitrogen atoms. The top of surface region 335 may be treated to enhance surface chemisorption in a subsequent ALD step 303 (FIG. 3C).

Referring to FIG. 3C, in a next step 303, a layer of intrinsic silicon 341 is deposited to a thickness Z8 on top of the nitridated region 335'. Deposition thickness Z8 can be as small as about 15 Å to about 50 Å. It can also be thicker if desired. In one embodiment, Atomic Layer Deposition (ALD) is used to form the 15 Å–50 Å thickness of the essentially dopant-free, silicon layer 341. Other precision forms of deposition 393 of the intrinsic silicon may be alternatively used. Those skilled in the art will appreciate that ALD is related to CVD (chemical vapor deposition) except that only one reactant at a time is pulse-supplied through the deposition chamber. A first of the pulse-supplied reactants (e.g., dichlorosilane $SiH_2Cl_2$) adheres to the substrate surface as a chemisorbed monolayer. The second pulse-supplied reactant (e.g., monosilane $SiH_4$) is provided to react with the chemisorbed monolayer of the first reactant to thereby form a monolayer of the desired reaction product (e.g., silicon). The process of pulse-supplying the first reactant and then the second is repeated N times until a product layer that is N monolayers thick is formed. The thickness of an ALD-defined layer such as 341 can be digitally controlled by the setting of the deposition repetition factor N. Thus, the thickness Z8 of ALD-defined layer 341 can be precisely controlled.

Referring to FIG. 3D, in a next step 304, an oxygen-containing atmosphere 394 is supplied to the top surface of layer 341 at an appropriate oxidizing temperature, such as about 750° C. to about 850° C. The hot oxygen-containing atmosphere 394 converts the exposed, intrinsic Si 341 (FIG. 3C) into thermally-grown $SiO_2$ 343. FIG. 3D shows the oxidation front 342 as having advanced only partially down into original layer 341 thereby still leaving some intrinsic Si in region 341'. The thickness, Z8' of the remaining intrinsic-Si 341' is less than the original thickness Z8 of FIG. 3C. Total thickness Z9 of the partially oxidized silicon is greater than Z8 though, because the thickness of thermally-grown oxide is typically twice that of the original silicon material.

Referring to FIG. 3E, in a next state 305, the oxygen-containing atmosphere 394' continues to be supplied to the top surface of oxidizing layer 343'. Thickness Z9' is about twice that of original thickness Z8 of the original, intrinsic silicon layer 341 (FIG. 3C). When the oxidation front 342' reaches the nitridated region 335', the rate of oxidation slows substantially because silicon nitride acts as a retardant to further oxidation. The degree of retardation will depend on the concentration of nitrogen atoms present as the oxidation front 342' descends down thickness Z7 and continues to bind oxygen to available silicon atoms.

Referring to FIG. 3F, in an optional next state 306, the oxygen-containing atmosphere 394" has continued to be supplied to the top surface of oxidized upper layer 343". Some of the silicon atoms that were in the $Si_xN_y$ layer 335' of state 305 (FIG. 3E) have been scavenged by the oxidizing process to form a thermally-grown, $Si_wO_v$ layer 344 where the w/v ratio may be greater than ½. Underlying region 335" has an increased nitrogen concentration and acts as an oxidation stop. The thickness Z10 of the thermally-grown, $Si_wO_v$ layer 344 may vary and may be in the range of, for example, 0–10 Å. Of importance, during the time that region 335" acts as an oxidation stop and the oxygen-containing atmosphere 394" continues to be supplied to the top surface of oxidized layer 343" at an appropriate oxidizing temperature (e.g., about 750° C.–850° C.), the stoichiometric bonding of oxygen atoms to silicon atoms in dopant-free region 343" continues to become more perfected and as a result, more high quality $SiO_2$ material is provided in region 343". Region 343" therefore becomes a high quality insulating region of precise thickness, particularly because it is essentially free of dopants (P or N type) and because it is thermally-grown and because the thickness of its precursor silicon material (341 of FIG. 3C) was precisely defined by ALD deposition or another, alike precision deposition method. Although ALD is disclosed as a precision deposition method, it is within the contemplation of the disclosure that less precise deposition methods such as CVD may be used to provide the intrinsic silicon 341 on top of nitridated region 335' (FIG. 3C).

Figure 3G:
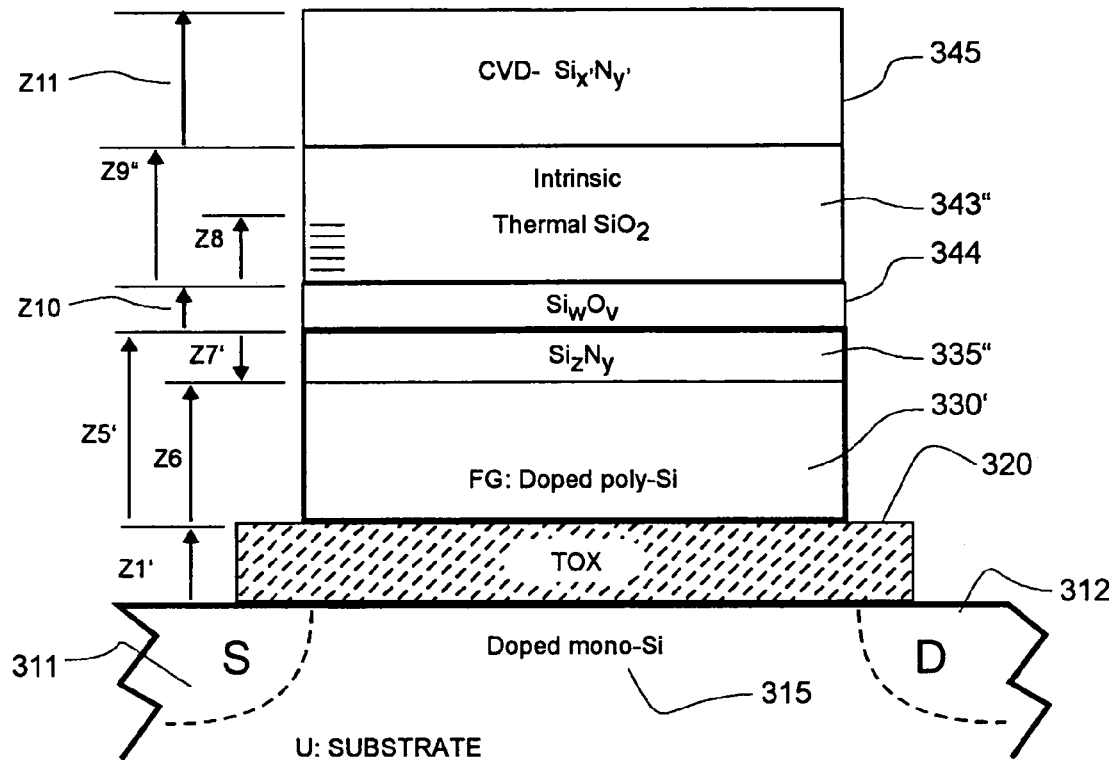
FIG. 3G is a cross sectional schematic diagram showing a fifth step (CVD deposition of SiN) in a continuation of the fabrication method of FIGS. 3D–3F.

Referring to FIG. 3G, in a next step 307, a silicon nitride layer 345 (e.g., $Si_3N_4$) is deposited (by CVD, ALD or otherwise) to a thickness Z11 on top of the thermally-grown $SiO_2$ layer 343". Typically Z11 will be in the range of about 50 Å to about 100 Å. It is within the contemplation of the disclosure to alternatively use other high-K dielectrics in place of $Si_xN$ in layer 345. The good insulative quality of the thermally-grown, $SiO_2$ layer 343" reduces the leakage current demands on the overlying, higher-K dielectric layer 345. Examples of alternative higher-K dielectric materials include SiON. The SiON could be alternatively formed by nitridating the top surface of layer 343" and thereby reducing thickness parameter Z9".

Referring to FIG. 3H, in a next step 308, a silicon oxide layer 346 ($Si_{x'}O_{y''}$) is deposited (by CVD, ALD or otherwise) to a thickness Z13 on top of the higher-K dielectric layer 345 (e.g., $Si_xN_{y'}$). This is followed in a subsequent step 309 by deposition (via CVD or otherwise) to a thickness Z15, of the polycrystalline silicon material that will define the conductively doped, CG layer 350. The conductivity-defining dopants of layer 350 may be introduced during the deposition of the polycrystalline silicon material of CG layer 350 and/or afterwards by ion implant.

FIG. 3H illustrates the completed, multigate structure 360 in which two, conductively doped, polysilicon gate electrodes, 330' (FG) and 350 (CG) are insulated from each other by a NONO structure 340 that includes at least one, thermally-grown $SiO_2$ layer 343" that is essentially free of dopants. This thermally-grown $SiO_2$ layer 343" provides enhanced protection against leakage currents. The illustrated NONO structure 340 also includes the nitridated lower region 335", the CVD-$Si_xN_{y'}$ layer 345 and the CVD-$Si_{x'}O_{y''}$ layer 346. The thermally-generated, $Si_wO_v$ layer 344 is optional.

Figure 4A:
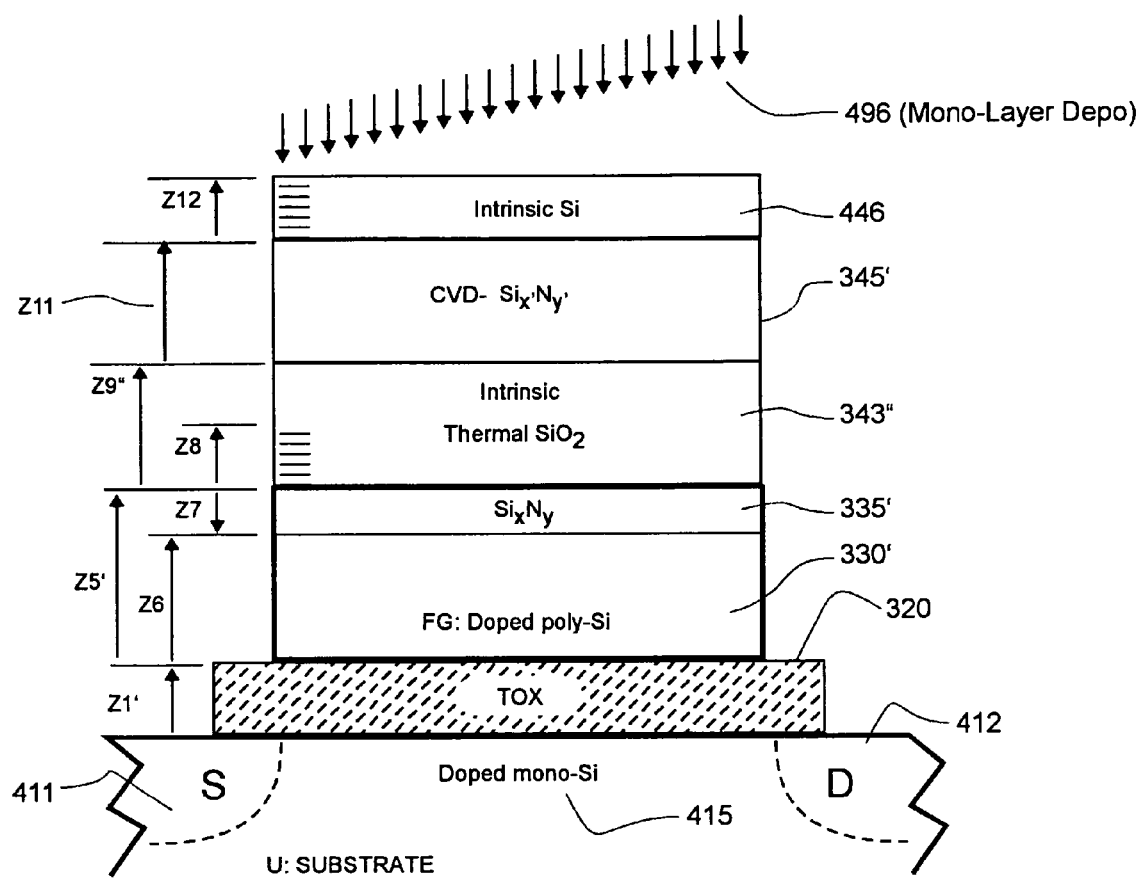
FIG. 4A is a cross sectional schematic diagram showing an alternate sixth step (second precise deposition of intrinsic silicon) in a continuation of the fabrication method of FIG. 3G.

Referring to FIG. 4A, an alternate process path is shown in cross section following the vapor deposition of silicon nitride layer 345 (e.g., $Si_3N_4$) in FIG. 3G. The concentration of nitrogen atoms at the top surface of the $Si_xN_{y'}$ layer 345 of FIG. 4A may be substantially the same as that deeper in the layer, or, if layer 345 is not completely stoichiometric silicon nitride (not all $Si_3N_4$) then the concentration of nitrogen atoms at the top surface may be augmented with further nitridation via ion implant, DPN (Decoupled Plasma Nitridation) or RPN (Remote Plasma Nitridation) so that concentration of nitrogen within region 345' is at least about 5% atomic nitrogen, and more preferably, at least about 10% atomic nitrogen. Various techniques can be used to form an oxidation-stopping gradient wherein nitrogen concentration in region 345' rises to as high as about 20% to 30% atomic nitrogen.

In subsequent step 407, a layer of intrinsic silicon 446 is deposited to a thickness Z12 on top of the nitrogen-containing region 345'. Deposition thickness Z12 can be as small as about 15 Å to about 50 Å. It can also be thicker if desired. In one embodiment, Atomic Layer Deposition (ALD) is used to form the 15 Å–50 Å thickness of the essentially dopant-free, silicon layer 446. Other precision forms of deposition 496 of the intrinsic silicon may be alternatively used.

Figure 4B:
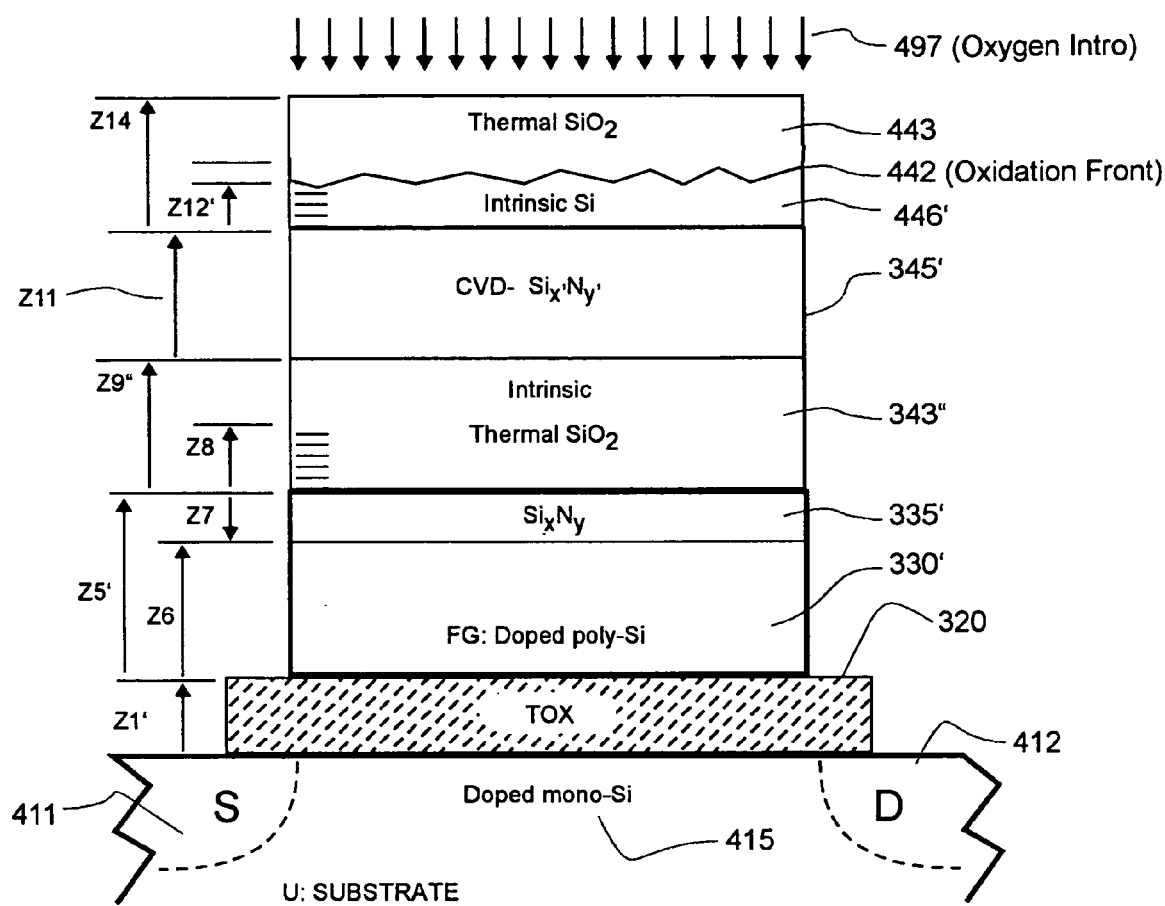
FIG. 4B is a cross sectional schematic diagram showing an alternate further step (begin oxidation of second precisely deposited Si) in a continuation of the fabrication method of FIG. 4A.

Referring to FIG. 4B, in a next step 408, an oxygen-containing atmosphere 497 is supplied to the top surface of layer 446 at an appropriate oxidizing temperature, such as about 750° C. to about 850° C. The hot oxygen-containing atmosphere 497 converts the exposed, intrinsic Si 446 (FIG. 4A) into thermally-grown $SiO_2$ 443. FIG. 4B shows the oxidation front 442 as having advanced only partially down into original layer 446 thereby still leaving some intrinsic Si in region 446'. The thickness, Z12' of the remaining intrinsic-Si 446' is less than the original thickness Z12 of FIG. 4A. Total thickness Z14 of the partially oxidized silicon is greater than Z12 though, because the thickness of thermally-grown oxide is typically twice that of the original silicon material.

Figure 4C:
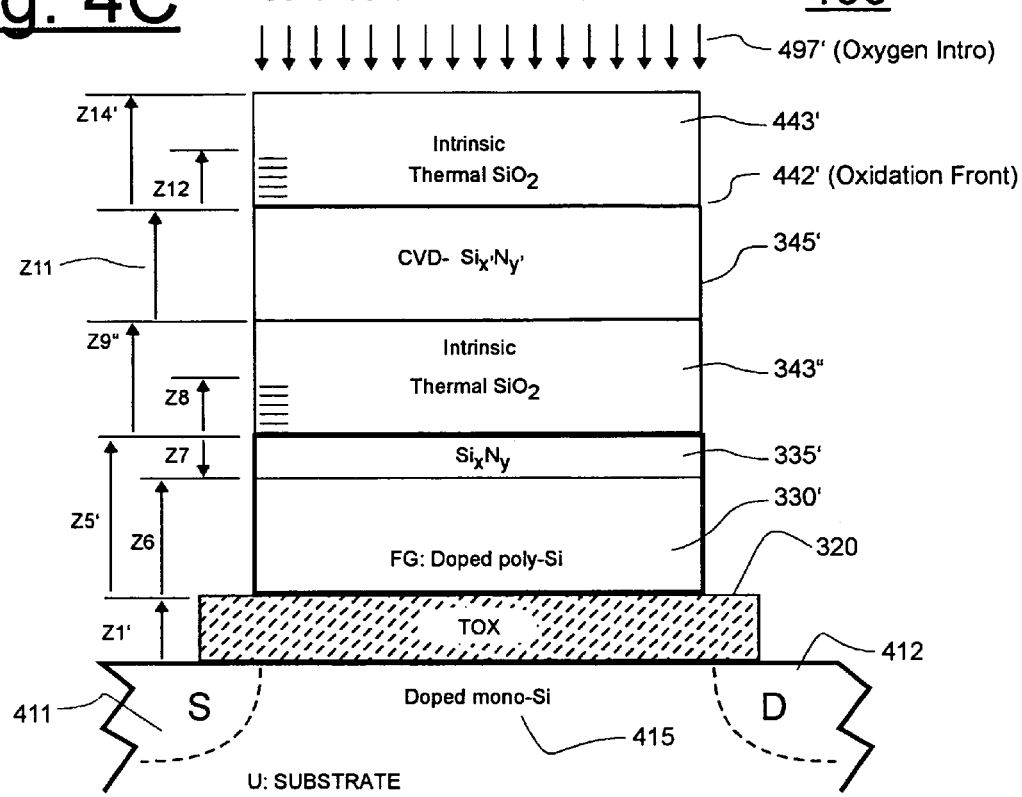
FIG. 4C is a cross sectional schematic diagram showing continuation of the oxidation begun by the step of FIG. 4B.

Referring to FIG. 4C, in a next state 409 of the oxidation process 408 started in FIG. 4B, the oxygen-containing atmosphere 497' continues to be supplied to the top surface of oxidizing layer 443'. Thickness Z14' is about twice that of original thickness Z12 of the original, intrinsic silicon layer 446 (FIG. 4A). When the oxidation front 442' reaches the nitrogen-containing region 345', the rate of oxidation slows substantially because silicon nitride acts as a retardant to further oxidation. The degree of retardation will depend on the concentration of nitrogen atoms present as the oxidation front 442' descends down thickness Z11 of the silicon nitride layer and continues to bind oxygen to available silicon atoms.

Figure 4D:
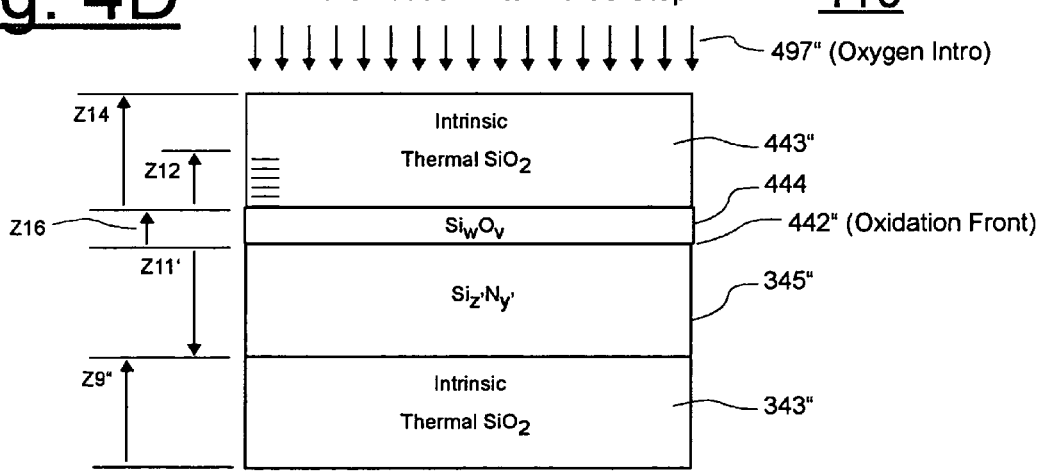
FIG. 4D is a cross sectional schematic diagram showing an optional further continuation of the oxidation begun by the step of FIG. 4B.

Referring to FIG. 4D, in an optional next state 410 of the oxidation process 408 started in FIG. 4B, the oxygen-containing atmosphere 497" has continued to be supplied to the top surface of oxidized upper layer 443". Some of the silicon atoms that were in the $Si_xN_y$ layer 435' of state 409 (FIG. 4C) have been scavenged by the oxidizing process to form a thermally-grown, $Si_wO_v$ layer 444 where the w/v ratio may be greater than ½. Underlying region 345" has an increased nitrogen concentration due to the silicon scavenging and acts as an oxidation stop. The thickness Z16 of the thermally-grown, $Si_wO_v$ layer 444 may vary and may be in the range of, for example, 0–10 Å, or more specifically if present, about 5 Å to about 10 Å. Of importance, during the time that region 345" acts as an oxidation stop and the oxygen-containing atmosphere 497" continues to be supplied to the top surface of oxidized layer 443", this being done at an appropriate oxidizing temperature (e.g., about 750° C.–850° C.), the stoichiometric bonding of oxygen atoms to silicon atoms in dopant-free region 443" continues to become more perfected and as a result, more high quality $SiO_2$ material is provided in region 443". Region 443" therefore becomes a high quality insulating region of precise thickness, particularly because it is essentially free of dopants (P or N type) and because it is thermally-grown and because the thickness of its precursor silicon material (446 of FIG. 4A) was precisely defined by ALD deposition 496 or another, alike precision deposition method. Although ALD is disclosed as a precision deposition method, it is within the contemplation of the disclosure that other deposition methods such as CVD (even if they may be less precise) may be used to provide the intrinsic silicon 446 on top of nitrogen-containing region 345' (FIG. 4A).

Figure 4E:
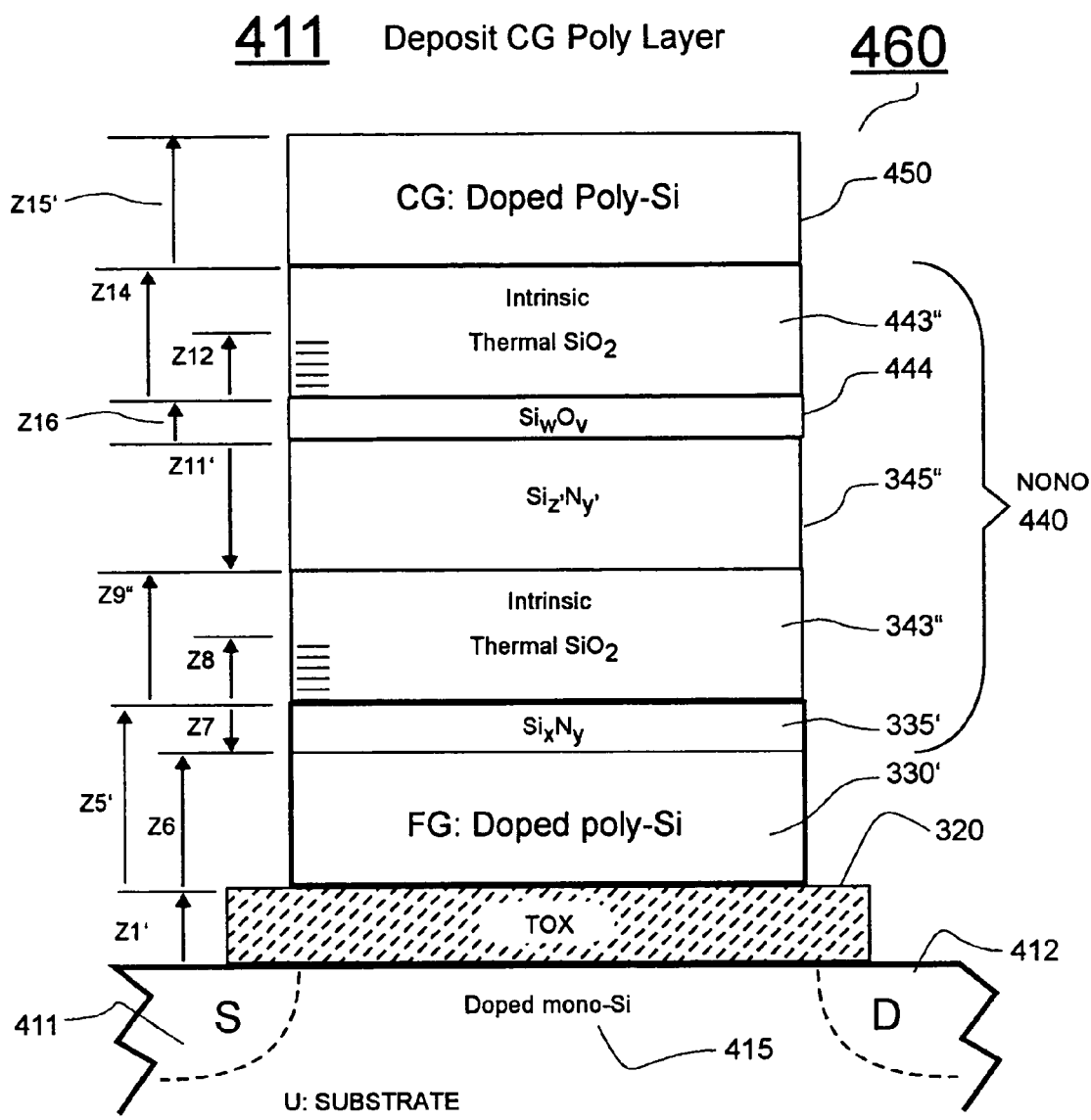
FIG. 4E is a cross sectional schematic diagram showing a yet further step (CVD deposition of doped poly-silicon) in a continuation of the fabrication method of FIG. 4A.

Referring to FIG. 4E, in a subsequent step 411, the polycrystalline silicon material that will define the conductively doped, CG layer 450 is provided (e.g., via CVD or otherwise) to a thickness Z15'. The conductivity-defining dopants of layer 450 may be introduced during the deposition of the polycrystalline silicon material of CG layer 450 and/or afterwards by ion implant.

FIG. 4E illustrates the completed, multigate structure 460 in which two, conductively doped, polysilicon gate electrodes, 330' (FG) and 450 (CG) are insulated from each other by a NONO structure 440 that includes at least two, thermally-grown $SiO_2$ layers, 343" and 443", that are each essentially free of dopants. These thermally-grown $SiO_2$ layers, 343" and 443", provide enhanced protection against leakage currents. The illustrated NONO structure 440 also includes the nitridated lower region 335", and the CVD-$Si_zN_{y'}$ layer 345". The thermally-generated, $Si_wO_v$ layer 444 is optional.

Figure 4F:
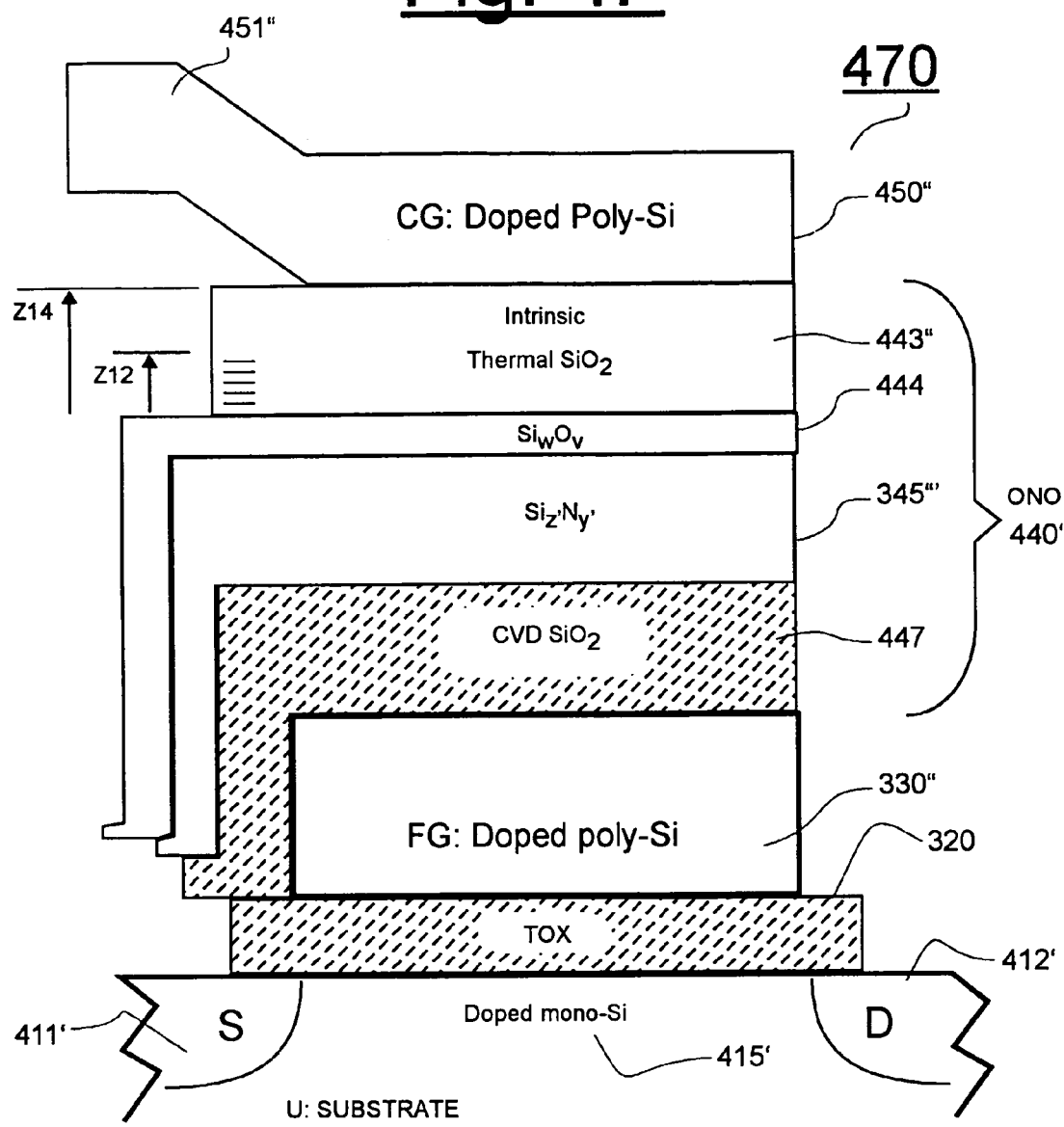
FIG. 4F is a cross sectional schematic diagram showing an alternate structure in which the step of FIGS. 3C–3F have been replaced by CVD deposition of silicon oxide.

Referring to FIG. 4F, an alternate structure 470 is shown wherein the process steps of FIGS. 3B-3F have been replaced by CVD deposition of silicon oxide to thereby provide layer 447 sandwiched between the FG electrode 330" and the $Si_zN_{y'}$ layer 345". Source and drain regions 411' and 412' where implanted after patterning of the FG electrode 330". CVD-SiO layer 447 provides sidewall and top insulation for the FG electrode 330". The overlying parts 345"'–443" may be bracketed within a shallow-trench isolation well (having HDP-oxide sidewalls, not shown). The resulting ONO structure 440' within the isolation well includes the thermally-grown and intrinsic, silicon dioxide layer 443". Layer 443" has high quality $SiO_2$ and therefore reduces charge leakage between the floating gate (FG) 330" and the control gate (CG) 450". Portion 451" is an extension of the control gate which is spaced higher up than Z14 and therefore does not affect electric field concentration near the channel 415' nearly as much as does the descended part of the control gate 450" (the part immediately above $SiO_2$ thickness Z14).

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

CROSS REFERENCE TO RELATED OTHER PUBLICATIONS

The following publications are cited here for purposes of reference and their disclosures are incorporated by reference:

(A) U.S. published application No.2003/0082300 A1 published May 1, 2003, entitled "Improved Process for Deposition of Semiconductor Films", and naming as inventors: Todd et al.

(B) U.S. published application No.2003/0166318 A1 published Sep. 4, 2003, entitled "Atomic Layer Deposition of Capacitor Dielectric", and naming as inventors: Zheng et al.

RESERVATION OF EXTRA-PATENT RIGHTS, RESOLUTION OF CONFLICTS, AND INTERPRETATION OF TERMS

After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. An isolation providing method comprising:
   (a) defining a first oxidation stop layer at a top surface portion of a first conductively-doped semiconductor layer;
   (b) using atomic layer deposition (ALD) to adhere a first intrinsic silicon layer onto the first oxidation stop layer, wherein said use of atomic layer deposition (ALD) defines a thickness of the first intrinsic silicon layer;
   (c) thermally oxidizing at least a sublayer portion of the first intrinsic silicon layer so as to thereby create a corresponding and thermally-grown, first intrinsic silicon oxide sublayer over the first semiconductor layer; and
   (d) disposing a second conductively-doped semiconductor layer above the first intrinsic silicon oxide sublayer so that the first intrinsic silicon oxide sublayer provides isolation between the first and second conductively-doped semiconductor layers.

2. The isolation providing method of claim 1 wherein:
   (c.1) said thermally-grown, first intrinsic silicon oxide sublayer includes stoichiometric silicon dioxide ($SiO_2$).

3. The isolation providing method of claim 1 wherein:
   (b.2) said thickness of the first intrinsic silicon layer is in a range of about 15 Å to about 50 Å.

4. The isolation providing method of claim 3 wherein:
   (a.1) said defining of the first oxidation stop layer includes creating a first silicon nitride composition having a nitrogen concentration of at least about 5% atomic.

5. The isolation providing method of claim 4 wherein:
   (a.1a) said first silicon nitride composition has a nitrogen concentration of at least about 10% atomic.

6. The isolation providing method of claim 4 wherein:
   (a.2) said creating of the first silicon nitride composition includes using Decoupled Plasma Nitridation (DPN) to introduce nitrogen into the top surface portion of the first conductively-doped semiconductor layer.

7. The isolation providing method of claim 4 wherein:
   (a.2) said creating of the first silicon nitride composition includes using Remote Plasma Nitridation (RPN) to introduce nitrogen into the top surface portion of the first conductively-doped semiconductor layer.

8. The isolation providing method of claim 4 wherein:
   (a.2) said creating of the first silicon nitride composition includes using ion implant to introduce nitrogen into the top surface portion of the first conductively-doped semiconductor layer.

9. The isolation providing method of claim 1 and further characterized by:
   (c.1) continuing said oxidizing of the first intrinsic silicon layer at least until a corresponding first oxidation front crosses into the first oxidation stop layer so as to thereby perfect formation of silicon dioxide in the thermally-oxidized, first intrinsic silicon layer.

10. The isolation providing method of claim 9 and further characterized by:
    (c.2) continuing said oxidizing of the first intrinsic silicon layer yet further so as to consume silicon atoms within the first oxidation stop layer and so as to thereby produce additional silicon oxide from the consumed silicon atoms.

11. The isolation providing method of claim 9 and further comprising:
    (e) providing a silicon nitride layer between the first and second conductively-doped semiconductor layers so that the combination of the silicon nitride layer and the perfected silicon dioxide in the thermally-oxidized, first intrinsic silicon layer provide isolation between the first and second conductively-doped semiconductor layers.

12. The isolation providing method of claim 11 and further comprising:
    (f) providing a second silicon oxide layer between the silicon nitride layer and the second conductively-doped semiconductor layer so that the combination of the second silicon oxide layer, the silicon nitride layer and the perfected silicon dioxide in the thermally-oxidized, first intrinsic silicon layer provide isolation between the first and second conductively-doped semiconductor layers.

13. The isolation providing method of claim 1 and further comprising:
    (e) providing a silicon nitride layer between the first and second conductively-doped semiconductor layers so that the combination of the silicon nitride layer and the first intrinsic silicon oxide sublayer provide isolation between the first and second conductively-doped semiconductor layers where said silicon nitride layer is separate from said first oxidation stop layer.

14. The isolation providing method of claim 13 and further comprising:
    (f) providing a second silicon oxide layer between the silicon nitride layer and the second conductively-doped semiconductor layer so that the combination of the second silicon oxide layer, the silicon nitride layer and the first intrinsic silicon oxide sublayer provide isolation between the first and second conductively-doped semiconductor layers.

15. The isolation providing method of claim 1 wherein:
    (a.1) the first oxidation stop layer includes a graduated concentration of nitrogen with a lower concentration of nitrogen being present at a top adhesion surface of the first oxidation stop layer where the first intrinsic silicon layer will adhere than deeper down in the first oxidation stop layer.

16. The isolation providing method of claim 1 wherein:
    (a.1) the first oxidation stop layer includes a graduated concentration of oxygen with a higher concentration of oxygen being present at a top adhesion surface of the first oxidation stop layer where the first intrinsic silicon layer will adhere than deeper down in the first oxidation stop layer.

17. The isolation providing method of claim 1 wherein:
(b.1) said use of atomic layer deposition (ALD) includes chemisorbing a monolayer of a first silicon-containing reactant to a top adhesion surface of the first oxidation stop layer.

18. A method of forming insulation comprising:
(a) defining an oxidation stop layer in a top portion of a first conductively-doped semiconductor layer;
(b) providing an essentially undoped semiconductor layer on the first conductively-doped semiconductor layer and above the first oxidation stop layer;
(c) oxidizing the essentially updoped semiconductor layer so as to thereby create a corresponding, essentially undoped and thermally-grown, first oxide sublayer over the first conductively-doped semiconductor layer; and
(d) disposing a second conductively-doped semiconductor layer above the first oxide sublayer so that the first oxide sublayer provides electrical insulation between the first and second conductively-doped semiconductor layers; wherein:
(a.1) said defining of the oxidation stop layer includes defining an adhesion surface on the top portion of a first conductively-doped semiconductor layer for adhering to the essentially undoped semiconductor layer; and wherein:
(b.1) said providing of the essentially undoped semiconductor layer includes chemisorbing a first reactant monolayer to the adhesion surface on the top portion of a first conductively-doped semiconductor layer, where the first reactant monolayer can react with a subsequently provided, second reactant to form a base monolayer of said essentially undoped semiconductor layer.

19. A method of providing a high quality silicon dioxide layer atop a first conductively-doped semiconductor layer, the method comprising:

(a) introducing nitrogen into the first conductively-doped semiconductor layer through a top portion of the first conductively-doped semiconductor layer;
(b) adhering an essentially undoped silicon layer to the top portion of the first conductively-doped semiconductor layer;
(c) thermally oxidizing the adhered and essentially undoped silicon layer at least until a corresponding oxidation front of said thermal oxidizing step reaches the nitrogen introduced into the first conductively-doped semiconductor layer; and
(d) continuing said thermal oxidizing step beyond when the corresponding oxidation front reaches the introduced nitrogen; and wherein said adhering includes using of atomic layer deposition (ALD) to adhere a predefined number of monolayers of essentially undoped silicon to the top portion of the first conductively-doped semiconductor layer.

20. The providing method of claim 19 and further comprising:
(e) disposing a second conductively-doped semiconductor layer above the thermally oxidized and essentially undoped silicon layer.

21. The providing method of claim 20 and further comprising:
(f) interposing a silicon nitride layer between the thermally oxidized and essentially undoped silicon layer and the second conductively-doped semiconductor layer.

22. The providing method of claim 20 and further comprising:
(g) interposing a silicon oxide layer between the silicon nitride layer and the second conductively-doped semiconductor layer.

* * * * *